United States Patent [19]

Lee

[11] Patent Number: 5,840,606

[45] Date of Patent: Nov. 24, 1998

[54] METHOD FOR MANUFACTURING A COMB-SHAPED LOWER ELECTRODE FOR A DRAM CAPACITOR

[75] Inventor: Claymens Lee, Fengshan, Taiwan

[73] Assignee: United Semiconductor Corp., Hsinchu, Taiwan

[21] Appl. No.: 977,539

[22] Filed: Nov. 25, 1997

[30] Foreign Application Priority Data

Jul. 28, 1997 [TW] Taiwan .................................. 86110698

[51] Int. Cl.⁶ .............................................. H01L 21/8242
[52] U.S. Cl. ............................................ 438/255; 438/398
[58] Field of Search ..................................... 438/238, 239, 438/253, 254, 255, 381, 396, 397, 398

[56] References Cited

U.S. PATENT DOCUMENTS 5,670,405 9/1997 Tseng ........................................ 438/398
5,670,407 9/1997 Tseng ........................................ 438/398

Primary Examiner—John Niebling
Assistant Examiner—Joni Y. Chang
Attorney, Agent, or Firm—Rabin & Champagne, P.C.

[57] ABSTRACT

A method for manufacturing a comb-shaped lower electrode for a DRAM capacitor including the steps of providing a substrate having a transistor and an insulating layer formed thereon, wherein the insulating layer contains a contact window opening exposing a source/drain region of the transistor; then, forming a polysilicon layer over the insulating layer, the contact window opening and the exposed source/drain region; next, forming a hemispherical grain silicon over the polysilicon layer. Thereafter, an oxide layer is formed over the hemispherical grain silicon, and then a silicon nitride layer is formed over the gaps between the hemispherical grain silicon exposing portions of the oxide layer. In the subsequent step, a plurality of hard mask layers are formed over the oxide layer not covered by the silicon nitride layer, and finally the silicon nitride layer, the oxide layer and portions of the polysilicon layer are removed using the hard mask layers to form a plurality of trenches.

8 Claims, 5 Drawing Sheets

METHOD FOR MANUFACTURING A COMB-SHAPED LOWER ELECTRODE FOR A DRAM CAPACITOR

BACKGROUND OF THE INVENTION

1. Field of Invention

The present invention relates to a method for manufacturing a semiconductor device. More particularly, the present invention relates to a method for manufacturing a comb-shaped lower electrode for a dynamic random access memory (DRAM) capacitor.

2. Description of Related Art

A DRAM capacitor is used for storing up DRAM data in a DRAM cell. Therefore, the DRAM capacitor must have a structure such that the capacitance of the DRAM capacitor is sufficiently large to achieve a long data retention time. However, with the continuous miniaturization of DRAM devices in ultra large scale integration (ULSI), dimensions of each memory cell is also correspondingly reduced. Hence, it is often necessary to increase the surface area of electrode plates to increase the capacitance. For example, one such method is to form hemispherical grain (HSG) silicon over the electrode plates. Nevertheless, when the level of integration is further increased, for example, in the fabrication of 64MB or higher capacity memory, the above capacitor structure is still inadequate.

DRAM is a kind of volatile memory. A digital data bit is stored in each memory cell depending on the charging state of the DRAM capacitor. FIG. 1 shows a circuit diagram of a DRAM cell. As shown in FIG. 1, the DRAM cell consists of a metal-oxide-semiconductor (MOS) transistor 11 whose gate electrode is connected to a word line (WL), and one of the source/drain electrodes is connected to the bit line (BL) while the other source/drain electrode is connected to ground through a capacitor 12. The capacitor 12 occupies a central position in the storage of a memory cell. When a large quantity of charges is stored in the capacitor 12, storage time for the digital data bit can be longer, the amplified read-out signal will be less affected by electrical noises, and soft errors such as those produced by alpha-particles will be greatly reduced.

There are a number of conventional methods for increasing the charge storage capacity of a DRAM capacitor. For example, some involves ways to increase the surface area of the conductive layer in a capacitor, and some involves a reduction in the thickness of its dielectric layer in a capacitor.

FIGS. 2A through 2D are cross-sectional views showing the progression of manufacturing steps for forming a stacked type of DRAM capacitor according to a conventional method. First, as shown in FIG. 2A, field oxide layers 21 are formed in a silicon substrate 20 for defining the boundaries of an active region. Then, a gate electrode, spacers 25, source/drain regions 24a and 24b are formed consecutively in the active region over the substrate 20 constituting a transistor. The gate electrode includes a tungsten silicide layer 22 and a first polysilicon layer 23.

Next, as shown in FIG. 2B, a first insulating layer 26 is formed over the gate electrode, the source/drain regions 24a and 24b and the field oxide layer. The first insulating layer 26 can be formed, for example, by depositing tetra-ethyl-orthosilicate (TEOS) to a thickness of about 1500 angstroms using a low pressure chemical vapor deposition (LPCVD) method. Subsequently, microlithographic and etching processes are used to form a contact window opening exposing portions of the source/drain region 24a. Next, a polysilicon layer is deposited over the exposed portions of the source/drain region 24a, and then impurities are implanted into the polysilicon layer. In a subsequent step, tungsten silicide (WSi2) is deposited over the polysilicon layer. Then, microlithographic and etching processes are again used to define the polysilicon layer and the tungsten silicide layer to form a second polysilicon layer 27 and a tungsten silicide layer 28. Thereafter, a second insulating layer 29 is formed over the first insulating layer 26 and the tungsten silicide layer 28. The insulating layer 29 can be formed, for example, by depositing an oxide layer to a thickness of about 1500 angstroms using an atmospheric pressure chemical vapor deposition (APCVD) method. Subsequently, a borophosphosilicate glass (BPSG) layer having a thickness of about 7500 angstroms is formed by performing a heat reflow operation at a temperature of about 850° C. The BPSG layer is then etched back to form a BPSG layer 30 having a thickness of about 4500 angstroms. Thereafter, a silicon nitride layer (SiN) having a thickness of about 500 angstroms is deposited over the BPSG layer 30. Then, again using microlithographic and etching processes, a hard mask layer 31 functioning as an etching protection layer is defined.

Next, as shown in FIG. 2C, contact openings 32 are formed to expose portions of the source/drain regions 24b by etching away portions of the BPSG layer 30, the second insulating layer 29 and the first insulating layer 26. Then, a polysilicon layer having a thickness of about 1000 angstroms is deposited over the hard mask layer 31, the sidewalls of the contact openings 32 and the exposed source/drain terminal regions 24b. Next, the polysilicon layer is defined to form a third polysilicon layer 34.

Next, as shown in FIG. 2D, a dielectric layer 36 is deposited over the polysilicon layer 34. The dielectric layer 36 can be an oxide/nitride/oxide (ONO) three-layered composite structure, or a nitride/oxide (NO) two-layered composite structure, or a tantalum oxide (Ta2O5) layer, for example. Lastly, an impurities doped fourth polysilicon layer 37 is deposited over the dielectric layer 36 to form an upper electrode.

Subsequently, processes for the complete formation of a stacked DRAM capacitor is performed.

At present, the above capacitor structure is quite commonly used in DRAM cell. The method employed is to improve the surface morphology of the capacitor, and create various kinds of uneven surfaces. Although, the method is capable of increasing the capacitance of the capacitor somewhat, the extent of the increase is quite limited, and is not sufficient for smaller dimensional devices.

In light of the foregoing, there is a need in the art for improving the capacitance in a DRAM capacitor.

SUMMARY OF THE INVENTION

Accordingly, the present invention is directed to provide a method for forming a comb-shaped lower electrode for a DRAM capacitor that can greatly increase the surface area and hence the capacitance of the capacitor, and is useful for small dimensional devices.

To achieve these and other advantages and in accordance with the purpose of the invention, as embodied and broadly described herein, the invention includes the steps of providing a substrate having a transistor and an insulating layer formed thereon, wherein the insulating layer contains a contact window opening exposing a source/drain region of the transistor; then, forming a polysilicon layer over the insulating layer, the contact window opening and the exposed source/drain region; next, forming a hemispherical grain silicon over the polysilicon layer. Thereafter, an oxide layer is formed over the hemispherical grain silicon, and then a silicon nitride layer is formed over the gaps between the hemispherical grain silicon exposing portions of the oxide layer. In the subsequent step, a plurality of hard mask layers are formed over the oxide layer not covered by the silicon nitride layer, and finally the silicon nitride layer, the oxide layer and portions of the polysilicon layer are removed using the hard mask layers to form a plurality of trenches.

The main characteristic of this invention is that the comb-shaped lower electrode of a DRAM capacitor produced by using the method in this invention has a greater surface area than the lower electrode of a DRAM capacitor produced by using a conventional method.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
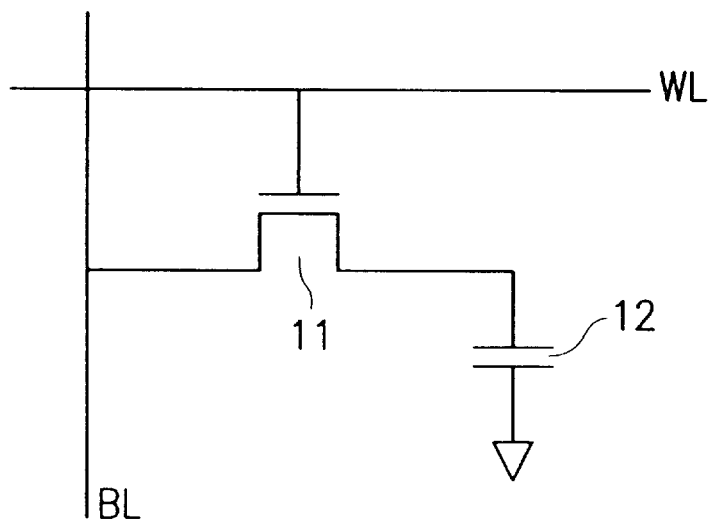
FIG. 1 shows a circuit diagram of a DRAM cell.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
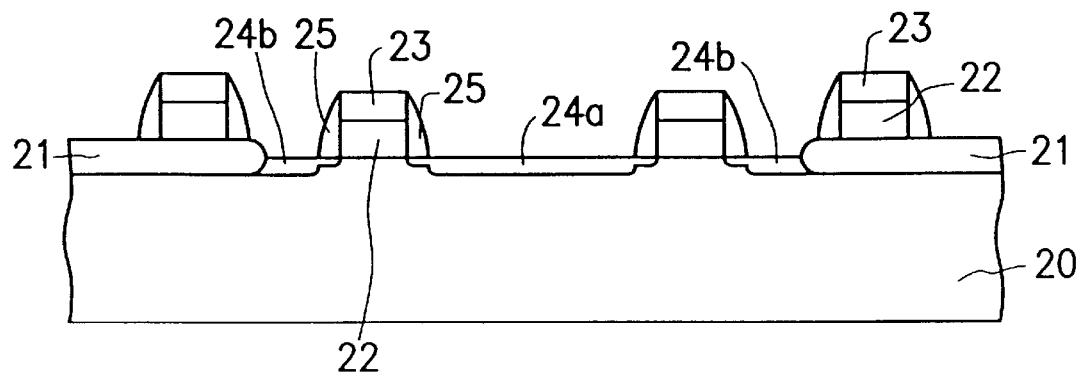
FIGS. 2A through 2D are cross-sectional views showing the progression of manufacturing steps for forming a stacked type of DRAM capacitor according to a conventional method.
Figure 2B:
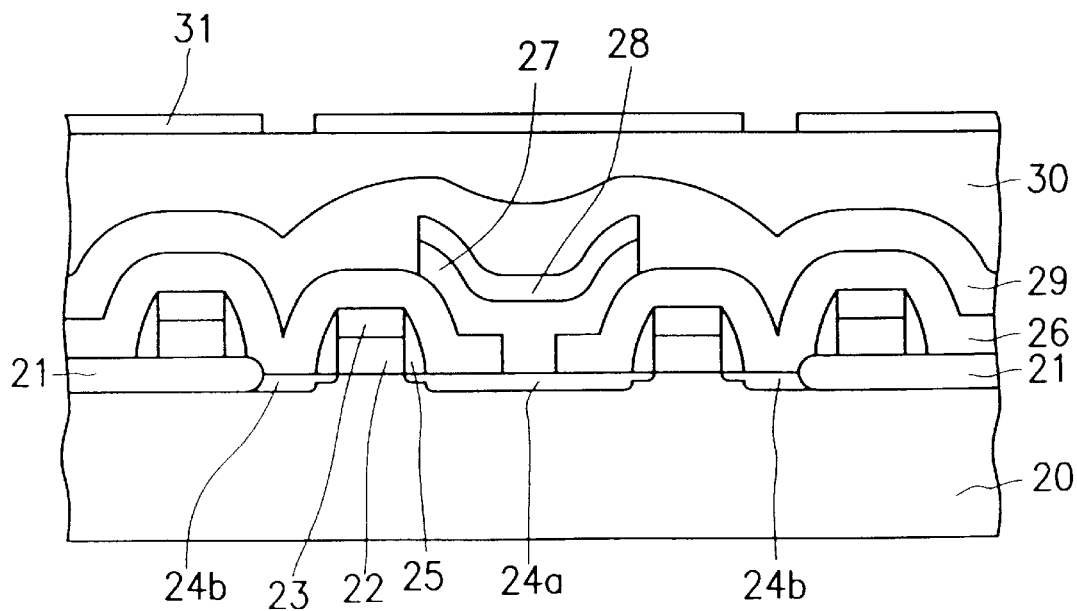
Figure 2C:
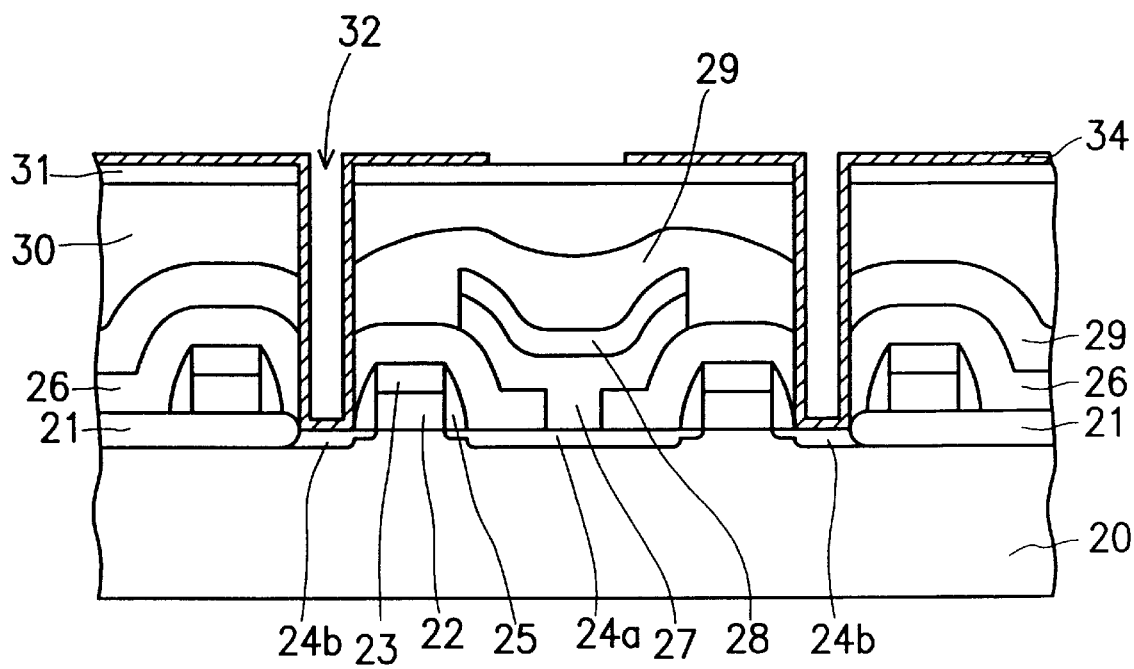
Figure 2D:
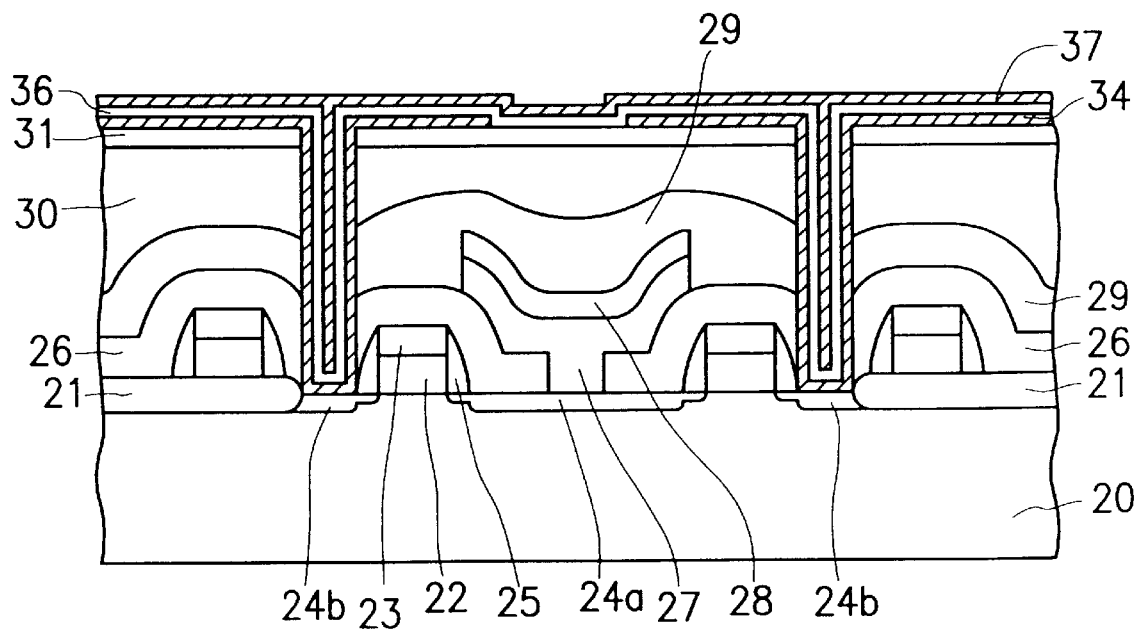

First, all the steps as shown in FIG. 2A and FIG. 2b are performed. That is, a substrate having a transistor and an insulating layer formed thereon are provided. Futhermore, a contact window opening exposing a source/drain region of the transistor is formed in the insulating layer. To simplify diagrammatically, the aforementioned structure is shown as a substrate layer 50 in FIGS. 3A–3E.

Figure 3A:
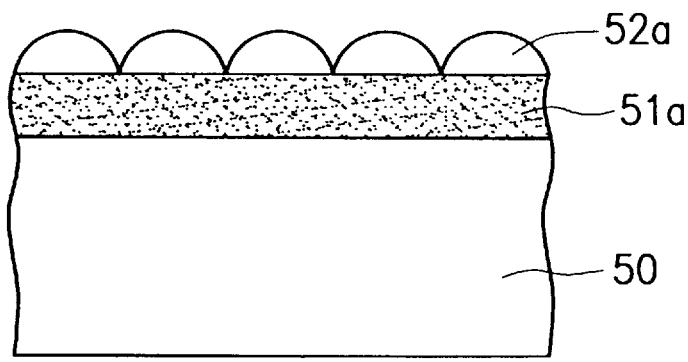
FIGS. 3A through 3E are cross-sectional views showing the progression of manufacturing steps for forming a comb-shaped lower electrode of a DRAM capacitor according to one preferred embodiment of this invention.

FIGS. 3A through 3E are cross-sectional views showing the progression of manufacturing steps for forming a comb-shaped lower electrode of a DRAM capacitor according to one preferred embodiment of this invention. First, as shown in FIG. 3A, a polysilicon layer 51a having a thickness of 1000 angstroms is deposited over the insulating layer and into the contact window opening of the substrate 50 using a low pressure chemical vapor deposition method. Next, a hemispherical grain silicon 52a is formed over the polysilicon layer 51a.

Figure 3B:
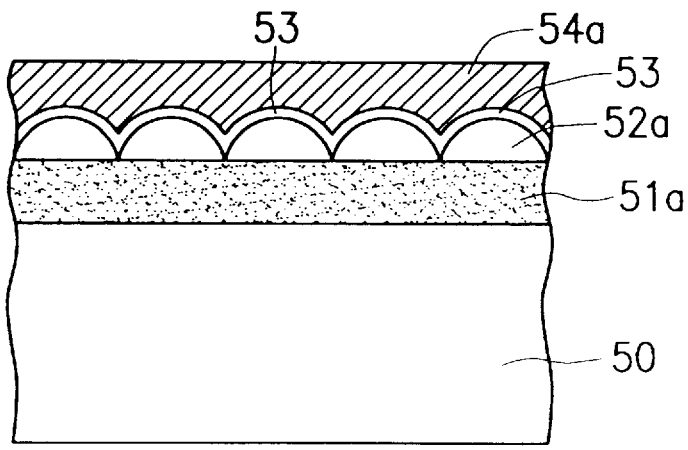

Next, as shown in FIG. 3B, a pre-oxidation operation is performed to oxidize a surface layer of the hemispherical grain silicon 52a. For example, a silicon dioxide layer 53 is formed over the hemispherical grain silicon 52a by placing the substrate 50 inside an oxidation furnace and passing in gaseous oxygen for the reaction. Thereafter, a silicon nitride layer 54a is deposited over the oxide layer 53 using a low pressure chemical vapor deposition method.

Figure 3C:
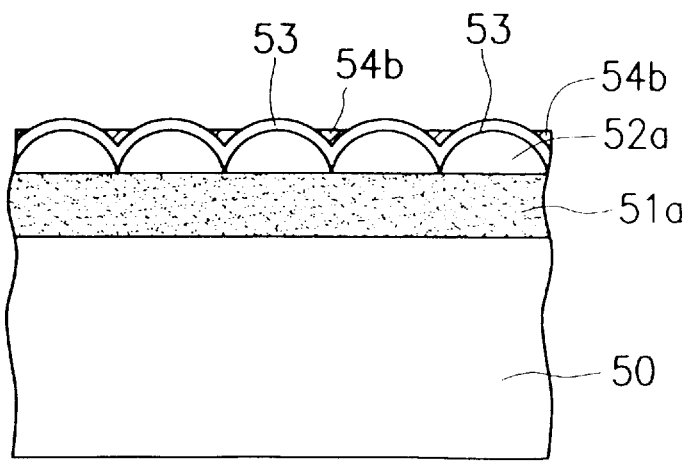

Next, as shown in FIG. 3C, a reactive ion etching (RIE) method having a highly selective etching capability between silicon nitride and silicon dioxide is used to remove portions of the silicon nitride layer 54a to form a silicon nitride layer 54b in the gaps between hemispherical grain silicon and exposing portions of the oxide layer 53.

Figure 3D:
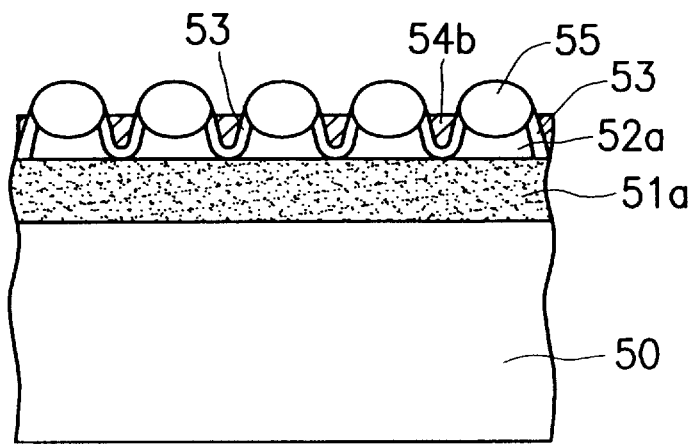

Next, as shown in FIG. 3D, portions of the hemispherical grain silicon 52 not covered by the silicon nitride layer 54b is oxidized to form hard masks using a wet oxidation method, wherein the wet oxidation is performed by placing the substrate 50 inside a moisture containing oxidation furnace for the reaction.

Figure 3E:
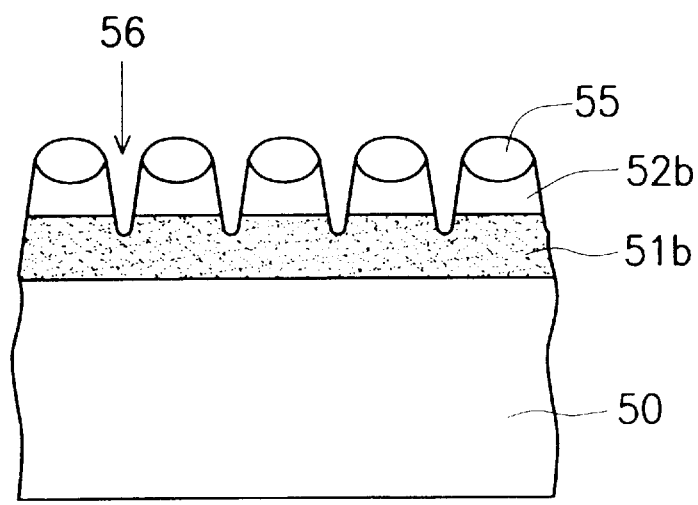

Next, as shown in FIG. 3E, using the hard masks as masks, a highly selective reactive ion etching method is used to remove the silicon nitride layer 54b, the oxide layer 53, portions of the hemispherical grain silicon 52a and portions of the polysilicon layer 51a to form finger-like protrusions and trenches 56 between the finger-like protrusions. The finger-like protrusions comprises a hard mask layer 55/hemispherical grain silicon 52b head and a polysilicon body 51b. The plurality of finger-like protrusions constitute the comb-shaped lower electrode of the capacitor.

The main characteristic of this invention is that the comb-shaped lower electrode of a DRAM capacitor produced by using the method in this invention has a greater surface area than the lower electrode of a DRAM capacitor produced by using a conventional method.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a DRAM capacitor comprising the steps of:

providing a substrate having a transistor and an insulating layer formed thereon, wherein the insulating layer contains a contact window opening exposing a source/drain region of the transistor;

forming a polysilicon layer over the insulating layer, the contact window opening and the exposed source/drain region;

forming a hemispherical grain silicon over the polysilicon layer;

forming an oxide layer over the hemispherical grain silicon;

forming a silicon nitride layer over gaps between the hemispherical grain silicon exposing portions of the oxide layer;

forming a plurality of hard mask layers over the oxide layer not covered by the silicon nitride layer; and removing the silicon nitride layer, the oxide layer and portions of the polysilicon layer below the oxide layer using the hard mask layers to form a plurality of trenches.

2. The method of claim 1, wherein the step of forming the polysilicon layer includes using a low pressure chemical vapor deposition method.

3. The method of claim 1, wherein the step of forming the oxide layer includes passing gaseous oxygen into an oxidation furnace for a reaction.

4. The method of claim 1, wherein the step of forming the silicon nitride layer includes the substeps of:

depositing a silicon nitride material over the oxide layer; and removing portions of the silicon nitride material to form the silicon nitride layer.

5. The method of claim 4, wherein the substep of depositing the silicon nitride includes using a low pressure chemical vapor deposition method.

6. The method of claim 4, wherein the substep of removing portions of the silicon nitride material includes using a reactive ion etching method.

7. The method of claim 1, wherein the step of forming the hard mask layers includes using a wet oxidation method.

8. The method of claim 1, wherein the step of forming the trenches includes using a selective reactive ion etching method.

* * * * *